United States Patent [19]

Muroga

[11] Patent Number: 5,473,547
[45] Date of Patent: Dec. 5, 1995

[54] LOGIC SYNTHESIZER FOR ENGINEERING CHANGES

[75] Inventor: Saburo Muroga, Urbana, Ill.

[73] Assignee: Fujitsu Limited, Kawasaki, Japan

[21] Appl. No.: 966,374

[22] Filed: Oct. 26, 1992

[51] Int. Cl.⁶ .................................................. G06F 17/50
[52] U.S. Cl. .......................................... 364/489; 364/488
[58] Field of Search .................................. 364/488, 489, 364/490, 491

[56] References Cited

U.S. PATENT DOCUMENTS

| | | | |
|---|---|---|---|
| 4,703,435 | 10/1987 | Darringer et al. | 364/489 |
| 4,882,690 | 11/1989 | Shinsha et al. | 364/490 |
| 5,029,102 | 7/1991 | Drumm et al. | 364/489 |
| 5,231,590 | 7/1993 | Kumar et al. | 364/491 |

OTHER PUBLICATIONS

Saburo Murago, *Advances in Computers*, vol. 32, "Computer–Aided Logic Synthesis for VSLI Chips", pp. 1–103, 1991.
Saburo Murago, *Logic Deisgn and Switching Theory*, 1979, :"Implementation of Logic Operations and Analysis of Combinational Networks", pp. 14–29, pp. 36–45.
Saburo Murago, *VSLI System Design*, 1982, "When and How to Design Very–Large–Scale Integrated Circuits," pp. 132–137, pp. 144–145.
Saburo Murago, *Logic Synthesizers*, "Transduction and Sylon", pp. 60–86.
Johnson Chan Limqueco et al., 1991, "Logic Optimization of MOS Networks", pp. 464–469.
Kuang–Chien Chen et al., 1991, "A Resynthesis Approach for Network Optimization", pp. 458–468.
Kuang–Chien Chen et al., *A Multi–Level Network Synthesizer*, 1989, "Sylon–Dream", pp. 1–4.
T. Shinsha et al., "Incremental Logic Synthesis Through Gate Logic Structure Identification", 1986, pp. 391–397.
Daniel Brand, *International Workshop on Logic Synthesis*, 1991, "The Taming of Synthesis", pp. 1–13.
Johnson Chan Limqueco et al., *A Mos Network Optimization Algorithm Using Permissable Functions*, 1990, "Sylon–Reduced", pp. 282–285.

*Primary Examiner*—Vincent N. Trans
*Attorney, Agent, or Firm*—Greer, Burns & Crain, Ltd.

[57] ABSTRACT

A synthesizer of logic networks of computers that has a capability of handling engineering changes necessitated by changing transistor circuits is disclosed. In order to design a computer, a computer system is designed first, and then the design of logic networks follows. Then transistor circuits are designed and then actually realized with transistors and other electronic components. But very often, transistor circuits need to be partly changed for various reasons. Responding to these engineering changes, the disclosed logic synthesizer can with great ease synthesize a new logic network such that the transistor circuit corresponding to this new logic network has necessary engineering changes made and keeps intact the portion of the original transistor circuit that the user of this synthesizer does not want to change.

10 Claims, 8 Drawing Sheets

LOGIC
NETWORK

TECHNOLOGY
MAPPING

TRANSISTOR
CIRCUIT

LOGIC SYNTHESIZER FOR ENGINEERING CHANGES

FIELD OF THE INVENTION

This invention relates to a synthesizer of logic networks of computers, in other words, a method of automatically synthesizing logic networks of computers, with a capability of handling engineering changes necessitated by changing transistor circuits.

BACKGROUND OF THE INVENTION

In the design of a computer, the system aspect of the computer, i.e., computer architecture is typically designed first. Then the design of logic networks follows. Then transistor circuits are designed and laid out on integrated circuit chips. In this design sequence, if logic networks with a large number of logic gates are to be designed, manual design is not efficient because of excessively long design time, many design mistakes, and other reasons. Thus, logic networks that require a large number of logic gates are designed increasingly often by a logic synthesizer, i.e., a computer program for automated logic network design. After a logic network is synthesized, a transistor circuit based on this logic network is designed, typically using a cell library. This conversion from the logic network to the transistor circuit is called technology mapping. Then the transistor circuit is laid out on an integrated circuit chip. When designers have a layout, they usually discover problems that they could not foresee at the time of design of the logic network. As examples, some connections may be too long with excessive delay time, some logic gates are erroneously designed, some buffers need to be added, some of the network output functions need to be changed due to specification changes, or some others need to be changed. These problems have to be corrected. The changes for the corrections are called engineering changes. Another example of the occasions that necessitate engineering changes is a modification of old transistor circuits. Designers know that some old transistor circuits that they have used for some time work very reliably with good performance and have already some manufacturing setup. They want to use them with partial changes. Thus, they need engineering changes.

Many of these engineering changes have to be done by changing the original logic network, though some others can be done by directly changing the transistor circuit. In this case, some connections and/or gates in the original logic network are changed or deleted (some of the network output functions may be consequently changed), but designers do not want to change some portion of the original logic network because they already spent a lot of time in making layout and delay time calculation on the corresponding portion of the transistor circuit. Thus, from the original logic network, the designer wants to synthesize a new logic network, by keeping some portion of the original logic network unchanged and by redesigning the remaining portion of the network to recover the changed network output functions to the original network output functions.

PRIOR ART

Typical of the logic synthesizers that have been available to date cannot be used for this purpose because of the lack of capability for such engineering changes.

SUMMARY OF THE INVENTION

The above and other problems are solved and an advance is made in art in accordance with the new present invention, featuring the new capability of synthesizing a new logic network with necessary engineering changes but without changing the portion of the original logic network that the designers do not want to change.

When a designer decides to make engineering changes, the designer makes some changes directly in the transistor circuit (e.g., adding buffers), if feasible, and then wants to find a good logic network that has the necessary engineering changes including these direct changes of the transistor circuit. According to the present invention, i.e., the logic synthesizer for engineering changes, first derives a logic network, where corresponding to each transistor gate in the given transistor circuit, one logic gate whose output function is exactly identical to the transistor gate's is created and these logic gates are connected in the exactly identical configuration to the transistor circuit's. Then, the designer specifies how some portion of this logic network (i.e., the first portion) must be changed (e.g., some connections and/or gates must be deleted according to the required engineering changes), and which portion (i.e., the second portion) of this logic network must not be changed. When the first portion is changed, some of the output functions of the logic network will in general be correspondingly changed. Then the logic synthesizer for engineering changes synthesizes a new logic network by repeating the following pruning and network transformation in the logic network excluding the second portion (i.e., the third portion), with addition of new gates and connections if necessary, until no further reduction is possible, while keeping the second portion intact and keeping the first portion changed as required:

PRUNING —A connection or logic gate is deleted from the logic network, if it is found to be redundant. In this case, connections and possibly gates in the second portion are also deleted if the designer allows doing so, when they are redundant.

NETWORK TRANSFORMATION —The current logic network is transformed into a new logic network. In doing so, connections between some gates in the second portion and some gates in the third portion can be deleted or added if necessary (the designer has to specify whether this is allowed for some connections).

During the repetition of pruning and network transformation, the network output functions that are changed by the required changes in the first portion and possibly by network transformation are recovered. When the logic synthesizer finishes its execution, the network output functions that are changed by the required changes in the first portion and possibly by network transformation are completely recovered to the original network output functions, the first portion is changed as required, and the second portion is intact.

DETAILED DESCRIPTION THE EMBODIMENT

Figure 1:
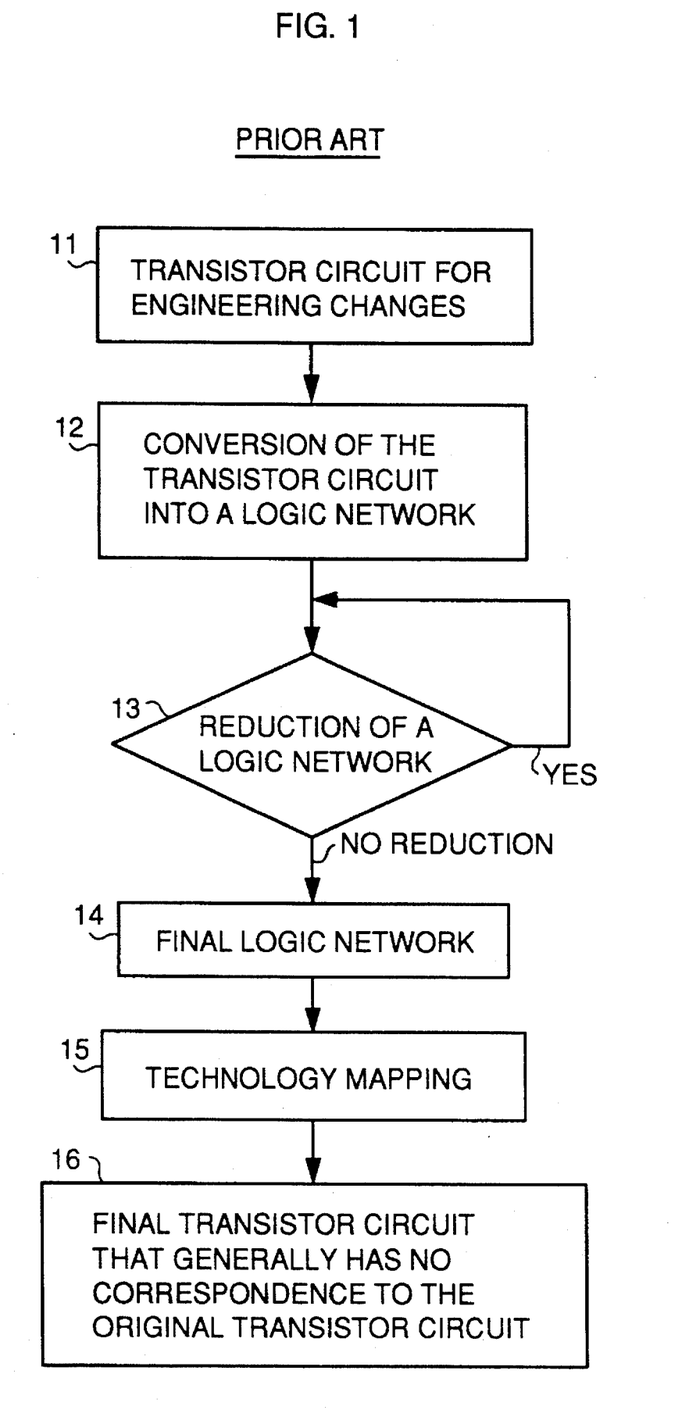
FIG. 1 shows the steps in a method according to a conventional logic network.
Figure 2:
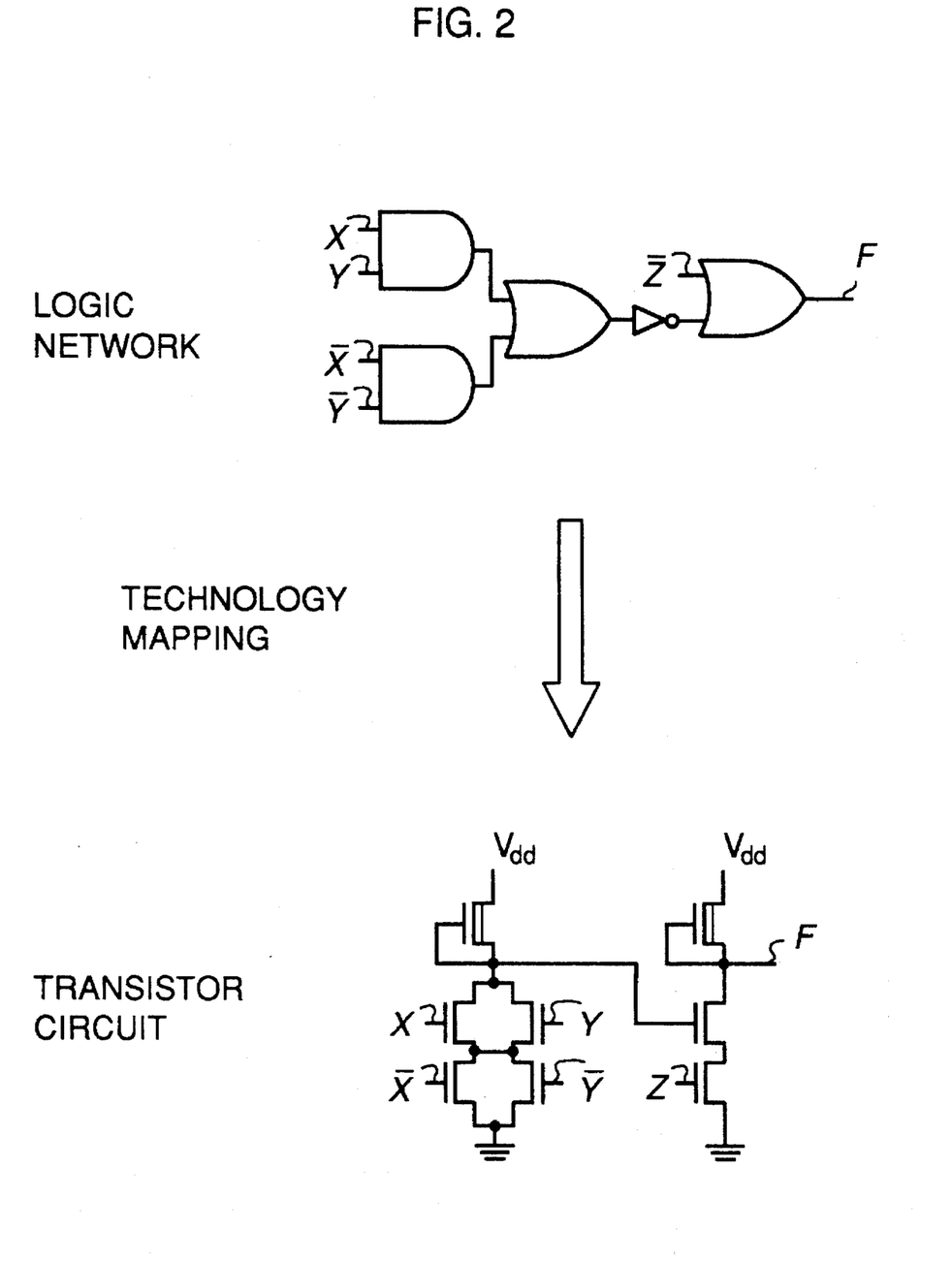
FIG. 2 illustrates technology mapping.

Logic synthesizers may be realized as computer programs and run on computers to produce synthesized logic networks. FIG. 1 shows a method of logic synthesizer according to the prior art. In block 11, a transistor circuit for engineering changes is called into the logic synthesizer. In block 12, this transistor circuit is converted into a logic network that has network output functions identical to the transistor circuit's. In a logic network in block 12 or during the reduction in block 13, at least some logic gates become those that are not realizable as transistor gates in the original transistor circuit. In block 13, reduction of this logic network is repeated until no further reduction (usually, reduction in area or delay time of a logic network) is possible. Then the final logic network is derived as shown in block 14. Then the logic network is converted into a transistor circuit by technology mapping in block 15 because some or all logic gates in the final logic network cannot be directly realized by transistor gates. This technology mapping is illustrated in FIG. 2, where the logic network (which may be part of a larger logic network) consisting of AND gates, OR gates, and an inverter shown in the top of FIG. 2, for example, is converted into the transistor circuit with the same output function F shown in the bottom of FIG. 2 because AND and OR gates are not directly realizable as transistor gates on integrated circuit chips. However, the final transistor circuit shown in block 16 has generally no correspondence to the final logic network in block 14 or the initial transistor circuit in block 11 with respect to connection configuration. This is clearly seen in the simple example in FIG. 2, where the logic network shown in the top of FIG. 2 consists of 5 logic gates, whereas the transistor circuit, shown in the bottom of FIG. 2, that is derived from this logic network by technology mapping consists of only 2 transistor gates which are connected in a different configuration, and where each logic gate does not necessarily have a corresponding transistor gate. Also, some of network input variables X, Y, and Z are interchanged with their complements $\overline{X}$, $\overline{Y}$, and $\overline{Z}$ respectively in the logic network and the transistor circuit in FIG. 2.

Figure 3:
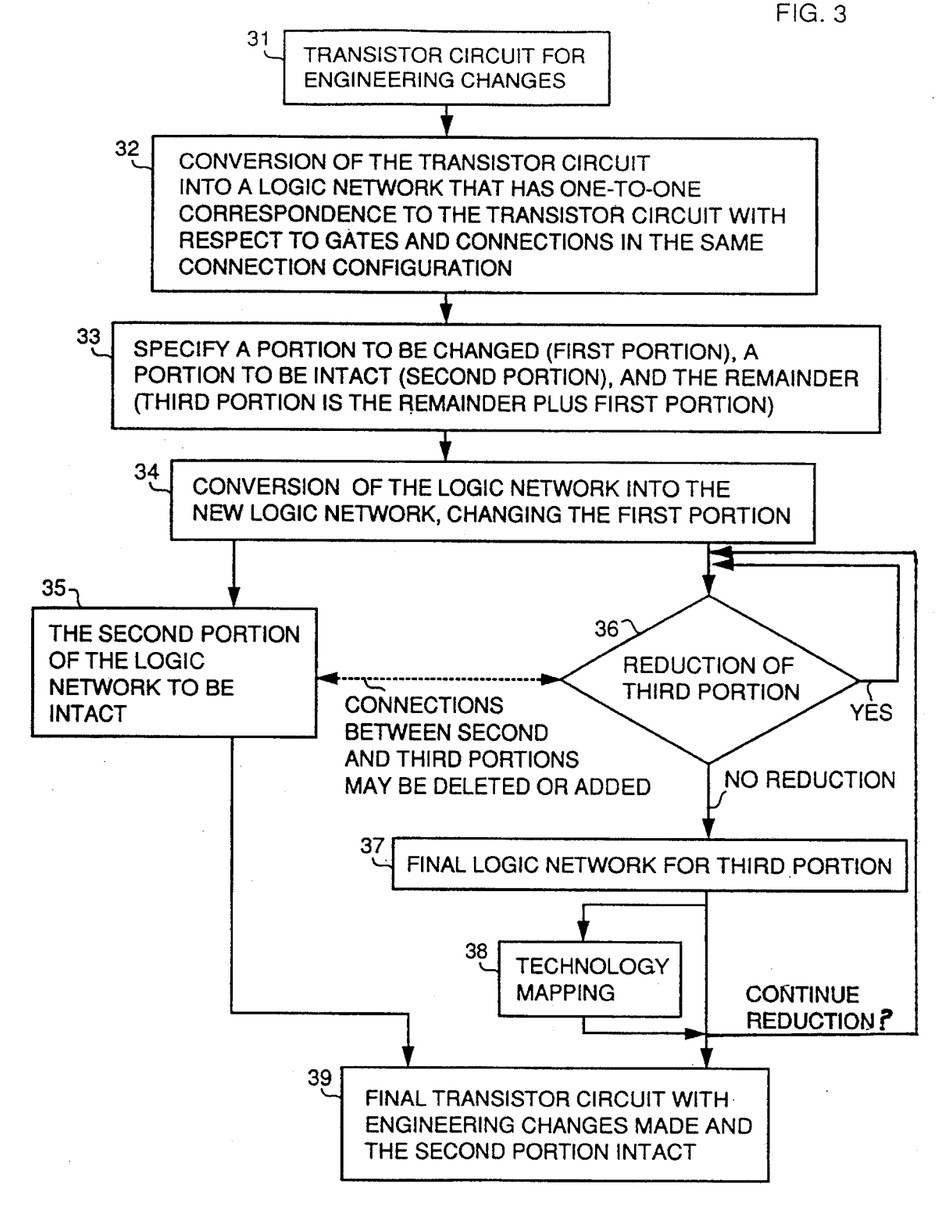
FIGS. 3 and 4 show the steps of a method of that logic network synthesizer for engineering changes, in accordance with the present invention.
Figure 4:
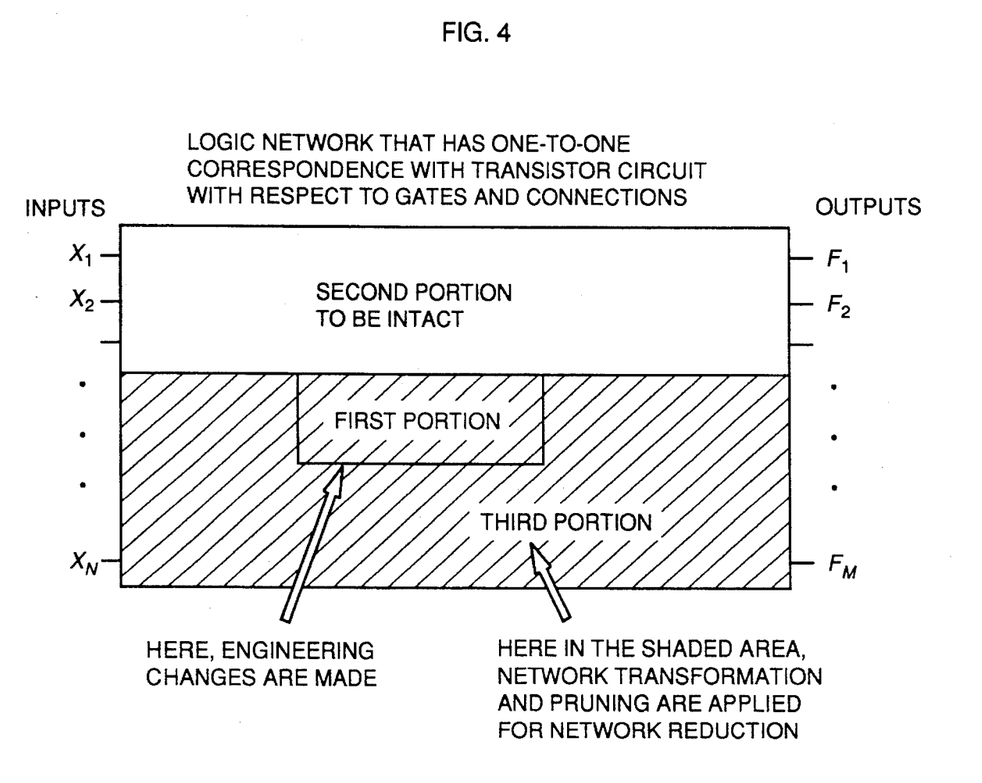

FIG. 3 illustrates the logic synthesizer according to the present invention. The synthesizer calls in the transistor circuit for engineering changes in block 31. Then in block 32, this transistor circuit is converted into the corresponding logic network that has one logic gate corresponding to each transistor gate with identical output function (or functions in case of certain types of transistor gates, such as an ECL gate that has OR and NOR outputs) and has the same connection configuration as the original transistor circuit. Thus, the logic network has one-to-one correspondence to the transistor circuit with respect to gates and connections. Then, in block 33, a portion to be modified according to the required engineering changes as the first portion in the logic network and a portion to be kept intact as the second portion are specified by the user. The remaining portion and the first portion combined, i.e., the third portion, is where gates and connections are freely changed (i.e., pruning and network transformation are repeatedly done) in order to synthesize a new logic network. This is illustrated in FIG. 4, where the logic network with network input variables $X_1, X_2, \ldots, X_N$ and network output functions $F_1, F_2, \ldots, F_M$ has one-to-one correspondence to the original transistor circuit with respect to gates and connections. In block 34 in FIG. 3, the logic network shown in block 33 is converted into the new logic network, making the changes only in the first portion as required by the engineering changes. These changes can be instantly made because the logic network has one-to-one correspondence to the original transistor circuit in connection configuration and consequently it is easy to identify gates and connections corresponding to those in the original transistor circuit to be changed. Then, keeping the second portion intact as indicated in block 35, the logic network except the second portion (i.e., the third portion shown as the shaded area in FIG. 4) is reduced by repeating pruning and network transformation, while adding new gates or connections if necessary, until no further reduction (usually, reduction in area or delay time of a logic network) is possible, as shown in block 36. Pruning and network transformation are described in detail in the following publication:

"The Transduction Method — Design of Logic networks based on permissible functions", by S. Muroga, Y. Kambayashi, H. C. Lai and J. N. Culliney, *The Institute of Electrical and Electronics Engineers Transactions on Computers*, vol. 38, 1989, pp. 1404–1424.

Consistent with the present invention, the reduction may be done by pruning and transformation, mixed wtih any logic synthesis methods which have been known to date or equivalents thereof. (For example, several logic gates that are connected among themselves can be combined into a single complex gate. After deriving a simpler logic expression for the output function of this complex gate, the complex gate can be decomposed into possibly fewer simple gates according to the new simpler logic expression than before.) In this case, connections between some gates in the second portion and some gates in the third portion, possibly along with some gates, may be added or deleted, if the user allows such a change (it is not possible when the layout of the transistor circuit for the second portion has been already made very compactly without leaving any room for adding new connections). Then, the final logic network for the third portion is derived in block 37. This final logic network needs to be converted into a transistor circuit by technology mapping in block 38, if some logic gates in this final logic network cannot be directly realized as transistor gates. Technology mapping may also be necessary if the logic network is not based on transistor gates or if the Transduction method is not used for reduction. Additionally, further reduction may be conducted subsequent to technology mapping. Otherwise, technology mapping in block 38 is not necessary. Then, in block 39, the second portion shown in block 35 and the final logic network in block 37, possibly with technology mapping in block 38, are combined into final transistor circuit, where the required engineering changes are made in the first portion, the second portion except some connections to the third portion that are deleted or added depending on the user's specification is kept intact, and the original network output functions are realized.

Figure 5:
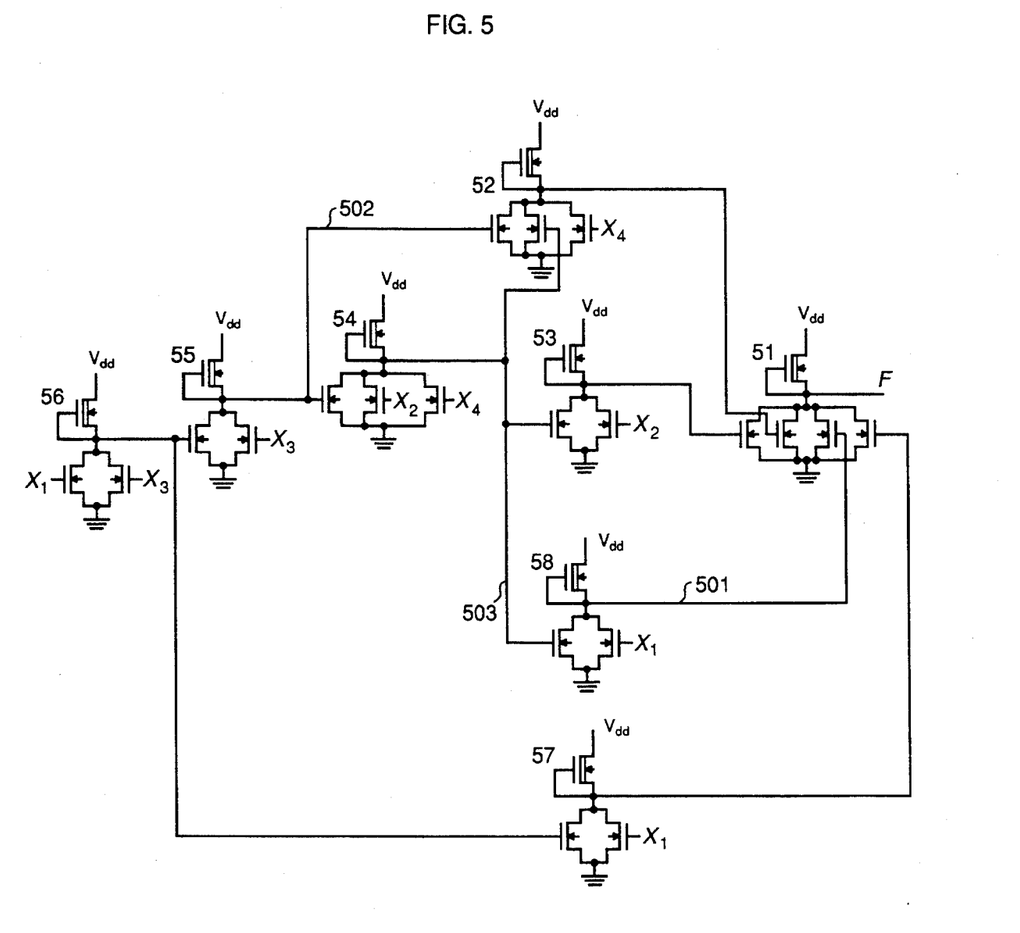
FIGS. 5, 6, and 7 to illustrate application of the invention illustrated in FIG. 3.
Figure 6:
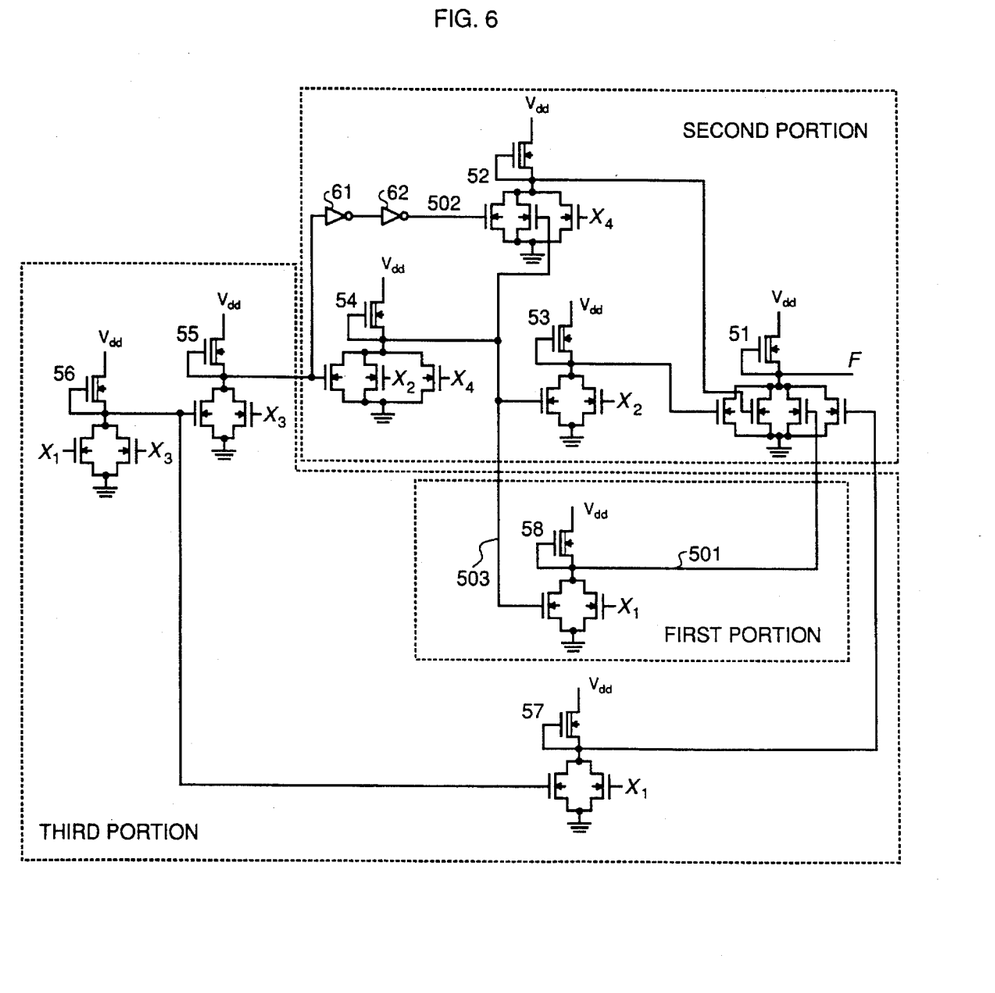

A simple example illustrating operation of the present invention is shown in FIG. 5. In FIG. 5, a static n-channel MOSFET circuit is shown for the sake of simplicity but electronic circuits of other types, such as CMOS or ECL, can be treated in the same manner. Suppose a user has the transistor circuit shown in FIG. 5, where the user wants to delete the connection 501 from transistor gate 58 to transistor gate 51 and also wants to reduce delay time of a signal over connection 502. The reduction of delay time over connection 502 can be done by simply adding a pair of inverters 61 and 62 as buffers, directly on the transistor circuit as shown in FIG. 6. Thus, after making engineering changes that can be made directly on the transistor circuit prior to use of the logic the logic synthesizer for engineering changes, we have the transistor circuit shown in FIGURE in this corresponds to a circuit to be operated on in the block 31 in FIG. 3.

Figure 8:
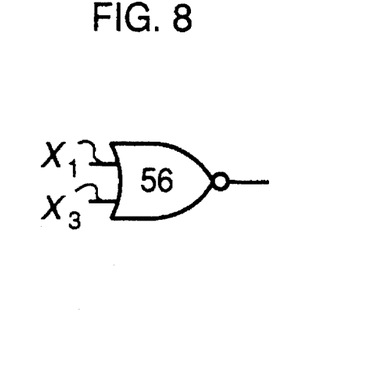
FIGS. 8, 9, and 10 illustrate conversion of transistor gates into logic gates as applied to block 32 in FIG. 3.
Figure 9:
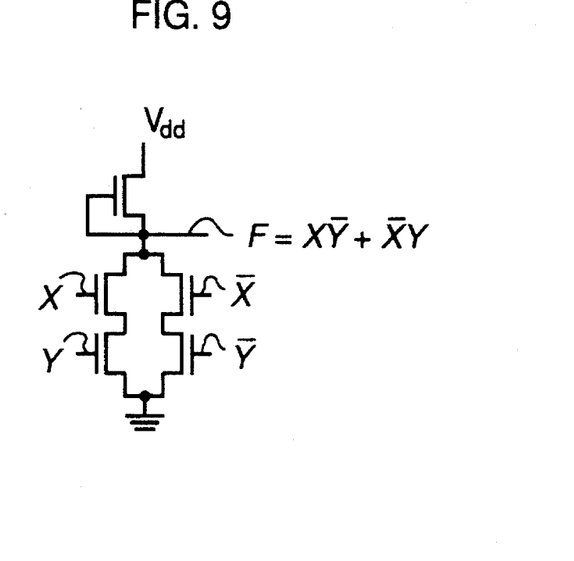
Figure 10:
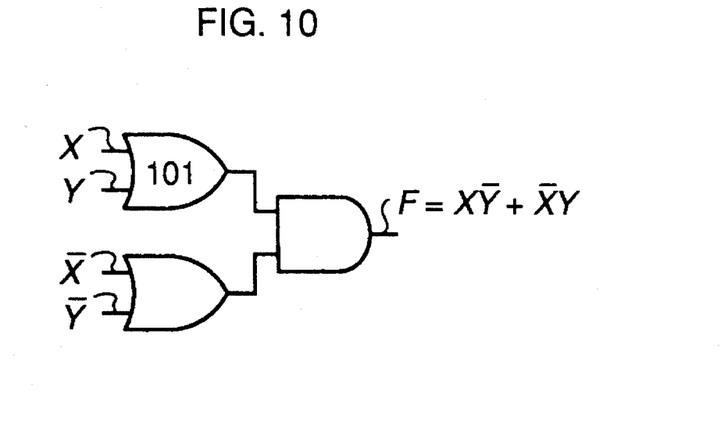

In block 32 in FIG. 3, this transistor circuit is converted into a logic network. In according to the present invention, for each transistor gate, of the transistor circuit one logic gate is created with the output function identical to that of the corresponding transistor gate. Thus, transistor gate symbol is used as a symbol for a logic gate in order to clarify the nature of our invention. For example, transistor gate 56 in FIG. 6 is expressed by the logic gate symbol shown in FIG. 8 in conventional logic gate representation. But in this disclosure of our invention, we use the transistor gate symbol to represent a logic gate for transistor gate 56 in FIG. 6. It should be noted that because of this one-to-one correspondence between logic gates and transistor gates, any inputs of each logic gate are not interchanged with their complements in the corresponding transistor gate, unlike the technology mapping in FIG. 2, when the final transistor circuit is realized from a synthesized logic network in block 39 in FIG. 3. As a more complex example, the transistor gate shown in FIG. 9 is represented by the small network of three logic gates shown in FIG. 10 in conventional logic gate representation. But in this disclosure of our invention, the transistor gate is used shown in FIG. 9 to represent a logic gate in order to clarify an important feature of the invention. The transistor gate symbol such as the one shown in FIG. 9 can be used for representing a logic gate if with its logic operation is considered, whereas it may also represent a transistor gate its internal voltages and currents are considered. If the transistor gate shown in FIG. 9 is represented by the small network of three logic gates shown in FIG. 10, it may imply that two OR gates and one AND gate are individually processed in network transformation and pruning, but the synthesizer of the present invention does not do this at least in the second portion which is left intact, though it is allowed to do this in the third portion, if the user wants. Of course, the transistor gate in may be expressed FIG. 9 by the small network consisting of 3 logic gates in FIG. 10, if the three logic gates in FIG. 10 are treated as one block throughout the execution of the logic synthesizer according to the present invention for engineering changes. In contrast, the conventional logic synthesizers that have been known to date treat each of these three logic gates as independent logic gates throughout their execution, and sometimes during their execution, the logic gate 101, for example, in FIG. 10 is combined into one complex logic gate with other logic gates that are converted from other transistor gates, such that this complex gate can be decomposed into fewer logic gates after deriving a new simpler logic expression for the output function of this complex gate than before. Treatment of each transistor gate as a logic gate itself the present in invention is particularly important for logic gates in the second portion for addition or deletion of connections between some gates in the second portion and some gates in the third portion.

Figure 7:
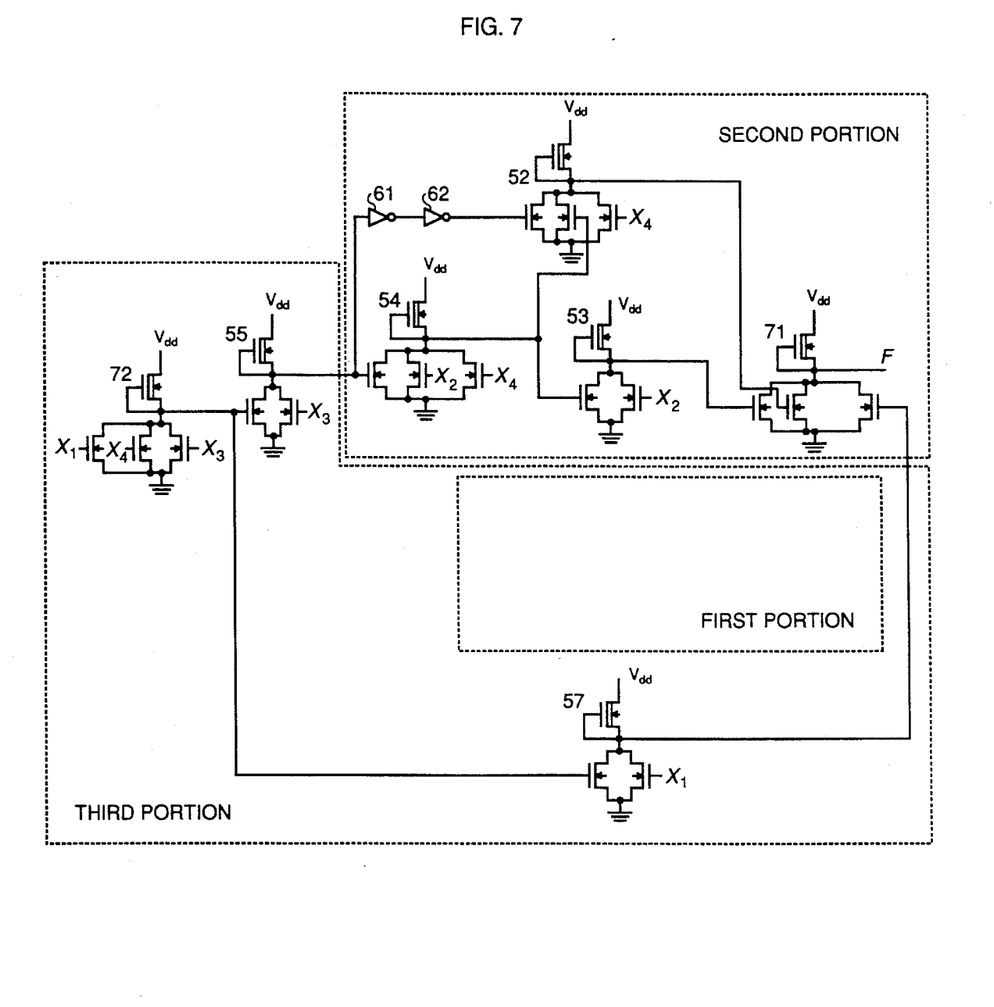

According to block 33 in FIG. 3 specification of portions is conducted. As seen in FIG. 6, the transistor gate 58 is included in the first portion, and gates 51, 52, 53, 54, inverters 61, 62 and connections among them are included in the second portion, as shown in the dotted lines. Then according to block 34 in FIG. 3, connection 501 is deleted as engineering changes require. Because connection 501 is the only fan out connection of transistor gate 58, transistor gate 58 and its input connection 503 from transistor gate 54 also can be deleted. It should be noted that if transistor gate 58 has fan out connections other than connection 501, then the transistor gate 58 and its input connections will remain in the first portion even after the deletion of the connection 501. So, generally the first portion will not be empty even after making the required engineering changes. Also, note that generally, even if engineering changes are made in the first portion, connections between some gates in the first portion and some gates in the second portion are not necessarily deleted.) By doing the required engineering changes in the first portion, the network output function F will generally be changed. Though the illustrative example has one network output, if a logic network has more than one output, some of the network output functions may not be changed. By reducing the third portion shown in the dotted line in FIG. 6 including the gates and connections that may remain in the first portion after the engineering changes by the repetition of pruning and network transformation according to block 36 in FIG. 3, the original function F is recovered at the network output gate 51. Thus, combining the logic network in the second portion and the new logic network in the third portion in block 39 in FIG. 3, the final transistor circuit is shown in FIG. 7, including the engineering changes made in the first portion (i.e., the first portion is empty in this particular example) and leaving the second portion intact, though two connections 501 and 503 between the second portion and the third portion are deleted. Comparing the transistor circuit in FIG. 7 and the initial transistor circuit in FIG. 6, only transistor gates 51 and 56 in FIG. 6 are changed respectively to transistor gate 71 in FIG. 7 which loses one transistor and transistor gate 72 in FIG. 7 which has only one additional transistor with network input variable $X_4$. Note that in the third portion, transistor gates 55, 57 and their fan-in and fan-out connections are not changed at all. Also, the inverters 61 and 62, which are added as part of the required engineering changes before using our logic synthesizer for engineering changes, are kept intact.

During the reduction in block 36 according to FIG. 3, the third portion in FIG. 6 is processed and connection 503 and transistor gate 58 are deleted in addition to connection 501. It is important to notice that generally, better logic networks may be derived by adding new connections between some gates in the second portion and some gates in the third portion, though no new connection is added in FIG. 7. But the addition is not always possible when the layout of the transistor circuit for the second portion that is already made is Very compact, and in this case, the user has to specify whether the addition is allowed.

Addition or deletion of connections between some gates in the second portion and some gates in the third portion, which may be done between blocks 35 and 36 in FIG. 3, can be done based on the Transduction method, which is described in detail in the previously referred publication of the Institute of Electrical and Electronics Engineers Transactions on Computers, 1989, pp. 1404–1424. In other words, connections between some gates in the second portion and some gates in the third portion can be added or deleted by repeatedly performing network transformation and pruning using permissible functions which is described in this publication.

Any intermediate logic network derived after the recovery of the original output functions of the logic network during the reduction in block 36 according to FIG. 3 can be realized as a transistor circuit without technology mapping, if every logic gate in this network has the complexity (i.e., specifying the connection configuration of transistors and/or the total number of transistors inside each gate such that each logic gate can be realized directly as a transistor gate with reasonably small delay time) under control, as described in the following publications. In addition, use of logic gates with complexity of each gate under control throughout the execution of the logic synthesizer for engineering changes has an advantage of fewer changes in the final transistor circuit in block 39 compared with the initial transistor circuit in block 31 in FIG. 3. Also, some of these intermediate logic networks may be more suitable for layout on integrated circuit chips, because of their different connection configurations, than the final logic network derived in FIG. 3. Thus, these intermediate logic networks are useful for the interface unit to be described in the following paragraph, whereby the user can choose logic networks best suitable for layout among them. Furthermore, if the output of each logic gate represents a negative function, then each logic gate can be treated as a negative gate. (A negative function of variables a, b, . . . , e is a logic function that can be expressed as the complement of a sum-of-products expression of the variables. For example, $\overline{ab+c}$, which is equal to $\overline{ac+bc}$, is a negative function. A logic gate whose output represents a negative function is called a negative gate. See the book titled "VLSI System Design", by S. Muroga, John Wiley, 1982.) Since transistor gates of many integrated circuitry used in the industry express negative functions, algorithms for designing logic networks with negative gates described in the following and other publications can be effectively utilized in the logic synthesizer for engineering changes.

"SYLON-DREAM: A multi-level network synthesizer," by K.-C. Chen and S. Muroga, *IEEE International Conference on Computer-Aided Design, Santa Clara, Calif., Nov.* 6–9, 1989, pp. 552–555.

SYLON-REDUCE: A MOS network optimization algorithm using permissible functions," by Limqueco, J. C., and S. Muroga, *IEEE International Conference on Computer Design*, Cambridge, Mass., Sep. 17–19, 1990, pp. 282–285.

"Logic optimization of MOS networks," by Limqueco, J. C., and S. Muroga, *Design Automation Conf.*, Jun. 17–21, 1991, San Francisco, pp. 464–469.

"Computer-aided logic synthesis for VLSI chips", by S. Muroga, *Advances in Computers*, vol. 32, pp. 1–103, ed. by M. C. Yovits, Academic Press, San Diego, Calif., 1991.

If the logic network synthesizer has an interface unit that facilitates the repeated use of the logic network synthesizer, it will be very useful for the users, because the users usually cannot precisely specify which portion of logic networks should be intact and they may find the need for further engineering changes with a new logic network which has engineering changes made. Important features of this interface unit are the display of unchanged gates and connections in the third portion of the logic networks (e.g., only transistor gate 56 in the third portion except the first portion in FIG. 6 is changed to transistor gate 72 in FIG. 7 but transistor gates 55 and 57 and all interconnections among the transistor gates are not changed) and the display of intermediate logic networks derived during the reduction in block 36 in FIG. 3 possibly with technology mapping combined with logic networks in block 35.

When engineering changes are made in the first portion possibly with deletion or addition of connections between some gates in the first portion and some gates in the second portion based on the user's specification, the requirement that the second portion could be loosened to allow addition of gates along with their connections into the second portion. But this modification of the invention can be regarded as a special case of the invention by regarding these gates being added into the third portion.

Each block or any part of it in FIG. 3 can be realized in computer programs or hardware.

I claim:

1. A method for conducting logic network synthesis comprising:

converting a transistor circuit having transistor gates into a logic network, each single transistor gate in the transistor circuit being converted to a corresponding single logic gate having an output function identical to that of the transistor gate from which it was converted;

specifying a first portion of the logic network which requires engineering changes, a second portion corresponding to a portion of the transistor circuit to be kept intact, and a third portion including the logic network outside of said first and second portions;

converting the first portion of the logic network to make said engineering changes; and producing a new transistor circuit from said first portion to which changes were made and said second and third portions while recovering network functions that were modified as a result of said making changes to said first portion of the logic network.

2. The method of claim 5 wherein:

said recovering of functions is accomplished by pruning and network transformation.

3. The logic synthesizer of claim 5, wherein:

the complexity of logic gates is controlled during execution of said method.

4. A method for conducting logic network synthesis comprising:

converting a transistor circuit having transistor gates into a logic network, each transistor gate in the transistor circuit being converted to a corresponding single logic gate having an output function identical to that of the transistor gate from which it was converted;

specifying a first portion of the logic network which requires engineering changes, a second portion corresponding to a portion of the transistor circuit to be kept intact, and a third portion including the logic network outside of said first and second portions;

converting the first portion of the logic network to make said engineering changes; and reducing the third portion of the logic network while recovering functions of the logic network which may have changed during said step of converting.

5. The method of claim 4, further comprising:

technology mapping said third portion, subsequent to said reducing and prior to said producing, to create a final logic network for said third portion.

6. The method of claim 4, wherein: said reducing includes modification of connections between logic gates in the second portion and logic gates in the third portion.

7. The method of claim 6, wherein: said modification of connections includes deletion of connections between logic gates in the second portion and logic gates in the third portion.

8. The method of claim 6, wherein: said modification of connections includes addition of connections between logic gates in the second portion and logic gates in the third portion.

9. The method of claim 4, wherein: said reducing includes pruning and network transformation.

10. The logic synthesizer of claim 4, wherein:

the complexity of logic gates is controlled during execution of said method.

\* \* \* \* \*

UNITED STATES PATENT AND TRADEMARK OFFICE
CERTIFICATE OF CORRECTION

PATENT NO. : 5,473,547
DATED : Dec. 5, 1995
INVENTOR(S) : Saburo Muroga

It is certified that error appears in the above-indentified patent and that said Letters Patent is hereby corrected as shown below:

Other Publications, delete "Deisgn" and insert --Design--.

Column 1, line 65, delete "of the".

Column 2, line 4, delete "new".

Column 2, line 62, delete "that" and insert --the--.

Column 2, line 64, delete "to".

Column 4, line 64, delete "the logic".

Column 4, line 64, after "FIGURE" insert --6--.

Column 4, line 65, delete "this" and insert --which--.

UNITED STATES PATENT AND TRADEMARK OFFICE
CERTIFICATE OF CORRECTION

PATENT NO. : 5,473,547
DATED : Dec. 5, 1995
INVENTOR(S) : Saburo Muroga

It is certified that error appears in the above-indentified patent and that said Letters Patent is hereby corrected as shown below:

Column 5, line 22, delete "is used" and insert --is used-- after "FIG. 9".

Column 5, line 25, delete "with".

Column 5, line 27, insert --if-- after "gate".

Column 5, line 35, delete "may be expressed" and insert --may be expressed-- after "FIG.9".

Column 5, line 49, delete "in" and insert --in-- before "the".

Column 6, line 32, delete "in" and insert --according to-- before "block", delete "according to" and insert --in-- before "FIG. 3".

Column 6, line 41, delete "Very" and insert --very-- before "compact".

Column 6, line 53, delete "which is" and insert --as--.

UNITED STATES PATENT AND TRADEMARK OFFICE
CERTIFICATE OF CORRECTION

PATENT NO. : 5,473,547
DATED : Dec. 5, 1995
INVENTOR(S) : Saburo Muroga

It is certified that error appears in the above-indentified patent and that said Letters Patent is hereby corrected as shown below:

Column 6, line 57, delete "in" and "according to" and insert --according to-- before "block" and insert --in-- before "FIG. 3".

Column 7, line 57, after "portion" insert --remain completely intact--.

Column 8, line 19, delete "5" and insert --1--.

Column 8, line 23, delete "5" and insert --1--.

Column 8, line 44, delete "." and insert --; and producing a new transistor circuit having said first portion with said engineering changes, said second portion which has been kept intact and said third portion which has been reduced.--.

Signed and Sealed this

Thirtieth Day of July, 1996

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,473,547
DATED : December 5, 1995
INVENTOR(S) : Saburo Muroga

It is certified that error appears in the above-indentified patent and that said Letters Patent is hereby corrected as shown below:

On the title page, item [73] Assignee: Delete "Fujitsu Limited, Kawasaki, Japan"

Signed and Sealed this

Fifth Day of November, 1996

Attest:

BRUCE LEHMAN

*Attesting Officer*     Commissioner of Patents and Trademarks